United States Patent [19]

Kobatake

[11] Patent Number: 4,910,710
[45] Date of Patent: Mar. 20, 1990

[54] INPUT CIRCUIT INCORPORATED IN A SEMICONDUCTOR DEVICE

[75] Inventor: Hiroyuki Kobatake, Tokyo, Japan

[73] Assignee: NEC Corporation, Tokyo, Japan

[21] Appl. No.: 275,871

[22] Filed: Nov. 25, 1988

[30] Foreign Application Priority Data

Nov. 25, 1987 [JP] Japan .................................. 62-298255

[51] Int. Cl.⁴ ................................................ G11C 7/00
[52] U.S. Cl. ............................ 365/189.01; 365/189.03
[58] Field of Search ............ 365/189.01, 185, 189.03, 365/189.05

[56] References Cited

U.S. PATENT DOCUMENTS 4,761,764  8/1988  Watanabe ............................ 365/185

Primary Examiner—Joseph A. Popek
Attorney, Agent, or Firm—Sughrue, Mion, Zinn, Macpeak & Seas

[57] ABSTRACT

An input circuit incorporated in a semiconductor device is provided in association with a multi-purpose input terminal which is shared by first and second input signals different in voltage level from each other, and the input circuit comprises an input buffer circuit for storing the first input signal, a series combination of a first field effect transistor, an intermediate node and a second field effect transistor coupled between the multi-purpose input terminal and an internal circuit supplied with the second input signal, a resistor coupled between a source of constant voltage and the intermediate node, a first control circuit producing a first gate control signal supplied to a gate electrode of the second field effect transistor, and a second control circuit capable of detecting the second input signal and producing a second gate control signal supplied to a gate electrode of the first field effect transistor, so that the second field effect transistor keeps off even if the first field effect transistor undesirable turns on.

15 Claims, 4 Drawing Sheets

PRIOR-ART

INPUT CIRCUIT INCORPORATED IN A SEMICONDUCTOR DEVICE

FIELD OF THE INVENTION

This invention relates to a semiconductor device and, more particularly, to an input circuit incorporated in the erasable and programmable read only memory device for distributing input signals different in voltage level to different destinations.

BACKGROUND OF THE INVENTION

A prior-art semiconductor memory device is usually provided with input circuits, and one of the input circuits is sometimes shared by an input signal and a programming signal or voltage Vpp and provided in association with a multi-purpose input terminal. The input circuit comprises an input signal circuit operative to propagate the input signal only, and a programming signal input circuit formed by a single transistor, thereby distributing the different signals to respective output terminals.

FIG. 1 is a diagram showing the circuit arrangement of an typical example of the prior-art input circuit incorporated in the semiconductor memory device. As shown in FIG. 1 of the drawings, the input circuit is associated with a multi-purpose input terminal 1 shared by the input signal IN and the programming signal or voltage Vpp and comprises an input signal circuit 2 coupled at the input node thereof to the multi-purpose input terminal 1 and at the output node thereof to an output terminal 4, and a programming signal input circuit 3 having an n-channel type MOS field effect transistor. The n-channel type MOS field effect transistor has the drain node coupled to the multi-purpose input terminal 1, the source node coupled to an output terminal 5 and a gate electrode to which a write-in data bit Di is supplied.

The behavior of the input circuit is described as follows.

When a memory cell array is ready for a read-out mode of operation, the multi-purpose input terminal 1 serves as a signal input terminal. Namely, the input signal circuit 2 receives the input signal supplied to the multi-purpose input terminal 1, and the output signal thereof is transferred to the output terminal 4. Since the write-in data bit Di remains in a low level at all times, the n-channel type MOS field effect transistor is turned off, thereby electrically isolating the output terminal 5 from the multi-purpose input terminal 1.

When the memory cell array is shifted to a write-in mode of operation, the multi-purpose input terminal 1 serves as a programming signal input terminal, so that the programming signal or voltage Vpp is supplied to the multi-purpose input terminal 1. The write-in data bit Di has been already shifted to a high level for writing the data bit of logic "1" level in one of the memory cell array specified by an address signal, and, accordingly, the n-channel type MOS field effect transistor 3 has been turned on. Then, the programming signal or voltage Vpp is transferred from the multi-purpose input terminal 1 to the output terminal 5. On the other hand, if no data bit of the logic "1" level is written into the memory cell array, the n-channel type MOS field effect transistor remains off due to write-in data bit Di of the low level, and, for this reason, the programming signal or voltage Vpp is not transferred from the multi-purpose input terminal 1 to the output terminal 5.

When the semiconductor memory device carries out the read-out mode of operation and the low level is supplied to the gate electrode of the n-channel type MOS field effect transistor at all times, the n-channel type MOS field effect transistor of the prior-art input circuit is liable to turn on due to an undershoot produced in the input signal IN applied to the multi-purpose input terminal 1. The n-channel type MOS field effect transistor is also liable to turn on under an application of noise swinging its voltage level into the negative voltage level. The n-channel type MOS field effect transistor is directly coupled at the drain node thereof to the multi-purpose input terminal 1 and at the source node thereof to the output terminal 5, so that the output terminal 5 is electrically coupled to the multi-purpose input terminal 1. The output terminal 5 is usually coupled to a sense amplifier circuit which is activated to quickly decide the logic level of the read-out data bit in the read-out mode of operation. The electrical connection between the multi-purpose input terminal 1 and the output terminal 5 results in reduction in voltage level at the output terminal 5, which has an undesirable influence on the read-out operation. Thus, a problem is encountered in the prior-art input circuit in the undesirable establishment of the electrical connection between the multi-purpose input terminal 1 and the output terminal 5.

SUMMARY OF THE INVENTION

It is therefore an important object of the present invention to provide an input circuit which is free from the problem inherent in the prior-art input circuit.

In accordance with the present invention, there is provided an input circuit incorporated in a semiconductor device, the input circuit being provided in association with a multi-purpose input terminal which is shared by first and second input signals different in voltage level from each other, comprising: (a) an input buffer circuit for receiving the first input signal; (b) a series combination of a first field effect transistor, an intermediate node and a second field effect transistor coupled between the multi-purpose input terminal and an internal circuit supplied with the second input signal; (c) resistor means coupled between a source of constant voltage and the intermediate node; (d) a first control circuit producing a first gate control signal supplied to a gate electrode of the second field effect transistor; and (e) a second control circuit capable of detecting the second input signal and producing a second gate control signal supplied to a gate electrode of the first field effect transistor.

BRIEF DESCRIPTION OF THE DRAWINGS

The features and advantages of an input circuit according to the present invention will be more clearly understood from the following description taken in conjunction with the accompanying drawings in which.

DESCRIPTION OF THE PREFERRED EMBODIMENTS

First embodiment

Figure 1:
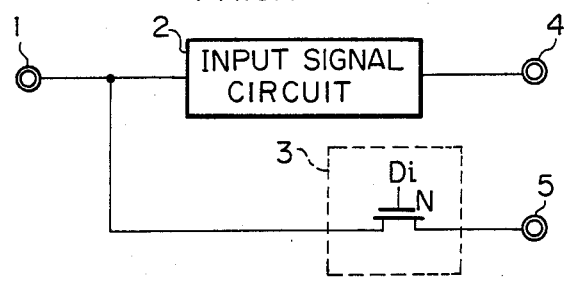
FIG. 1 is a diagram showing the circuit arrangement of a prior-art input circuit.
Figure 2:
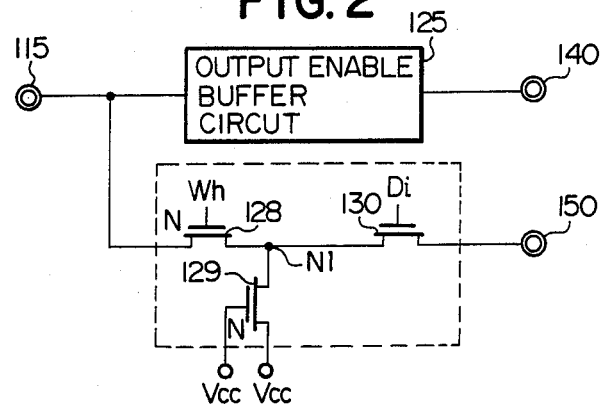
FIG. 2 is a diagram showing the circuit arrangement of an input circuit embodying the present invention.

Referring first to FIG. 2 of the drawings, there is shown the circuit arrangement of an input circuit embodying the present invention. The input circuit illustrated in FIG. 2 is provided in association with a multi-purpose input terminal 115 and comprises an output enable buffer circuit 125, a series combination of first and second n-channel type field effect transistors 128 and 130, and a load transistor 129 coupled between a source of constant voltage Vcc and an intermediate node N1 between the first and second n-channel type field effect transistors 128 and 130.

The input circuit thus arranged is operative to transfer an output enable signal OE with over-bar of about 5 volts from the multi-purpose input terminal 115 to an output node 140. In this situation, no data bit is supplied to the n-channel type field effect transistor 130, and, accordingly, the n-channel type field effect transistor 130 remains off, thereby blocking the output enable signal OE with over-bar. On the other hand, if a programming signal or voltage Vpp of about 12.5 volts is supplied to the multi-purpose input terminal 115, a write-in enable signal Vp of about 15.5 volts is produced and supplied to the gate electrode of the n-channel type field effect transistor 128, thereby allowing the n-channel type field effect transistor 128 to turn on to propagate the programming signal or voltage Vpp. Then, if a data bit Di of a high level is supplied to the gate electrode of the n-channel type field effect transistor 130, the n-channel type field effect transistor 130 also turns on to transfer the programming signal or voltage Vpp to an output node 150. However, the data bit of a low voltage level is supplied to the gate electrode of the n-channel type field effect transistor 130, the n-channel type field effect transistor 130 is turned off to block the programming signal or voltage Vpp.

Figure 3:
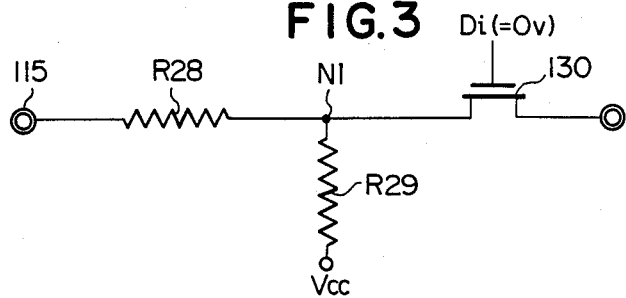
FIG. 3 is a diagram showing the equivalent circuit of the input circuit shown in FIG. 2.

If an undershoot takes place in the output enable signal OE with over-bar, the n-channel type field effect transistor may turn on due to a difference in voltage level between the gate electrode thereof and the multi-purpose input terminal 115 excessing the threshold voltage of the n-channel type field effect transistor 129. However, the n-channel type field effect transistor 130 hardly turns on, because the source of positive voltage level Vcc is coupled to the intermediate node N1 at all times. Turning to FIG. 3 of the drawings, there is shown the equivalent circuit of the input circuit illustrated in FIG. 2 in which R28 and R29 represent the respective on-resistances of the n-channel type field effect transistors 128 and 129. The voltage level $V_{N1}$ at the node N1 is calculated as follows $$V_{N1} = (R28 \pm Vcc - R29 \times V)/(R28 + R29)$$

where V is the voltage level of the output enabling signal OE with over-bar upon undershoot. Then, the channel resistances R28 and R29 should be determined as follows $$(R28 \times Vccd - R29 \times V)/(R28 + R29) > -Vth$$

where Vth is the threshold voltage of the n-channel type field effect transistor 130. For example, if Vcc, V and Vth are selected to be 6.0 volts, −1.0 volt and 0.5 volt, respectively, the ratio (R2/R1) should be smaller than 13.

Second embodiment

Figure 4:
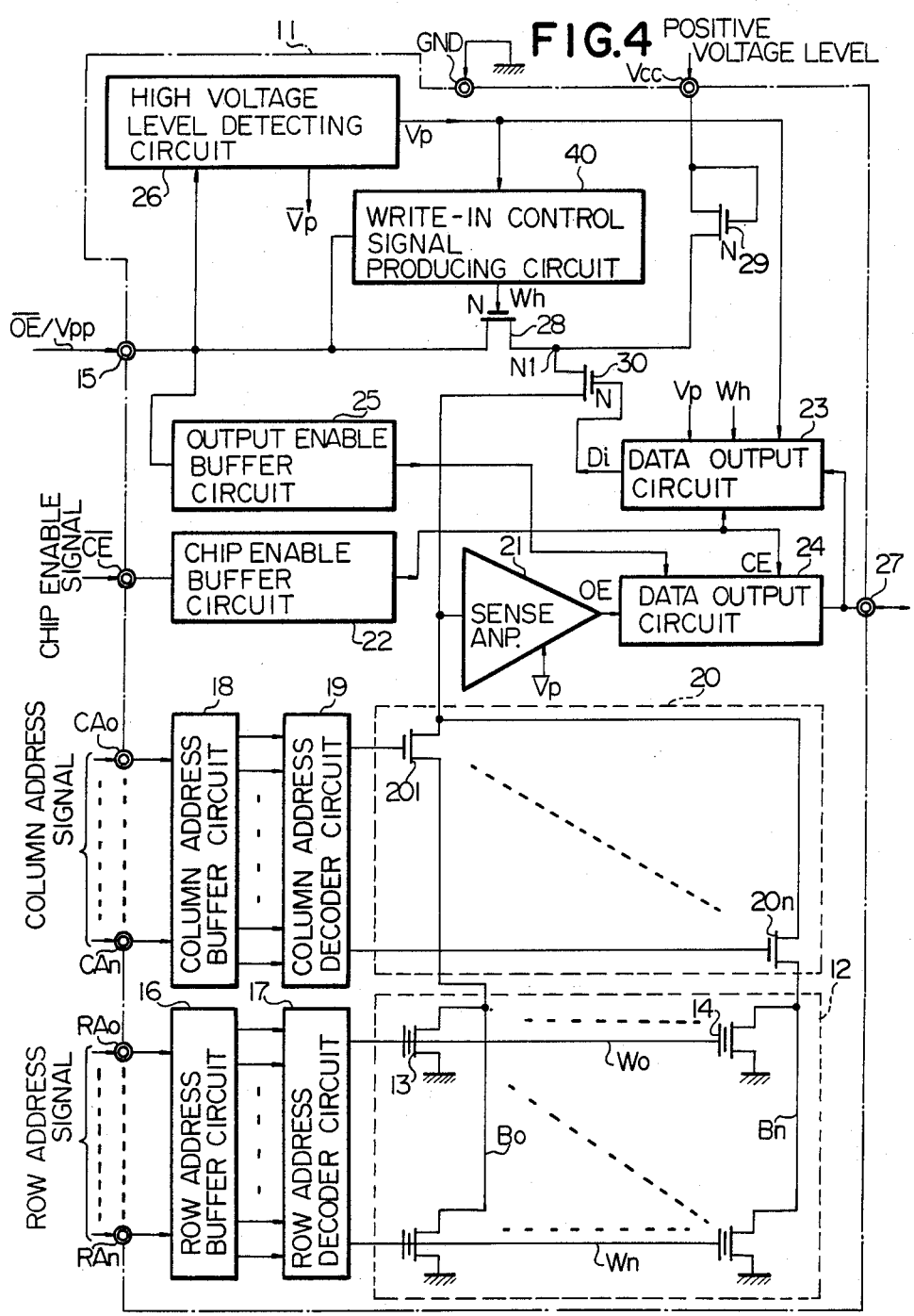
FIG. 4 is a block diagram showing an erasable and programmable read only memory device provided with an input circuit embodying the present invention.

Turning to FIG. 4 of the drawings, there is shown the circuit arrangement of an erasable and programmable read only memory device which is fabricated on a semi-conductor chip 11. The erasable and programmable read only memory device comprises a memory cell array 12 having a plurality of memory cells of the floating gate type arranged in rows and columns, and the memory cell array 12 includes memory cells 13 and 14. The control gates of the memory cells in each row are coupled to each of word lines W0 to Wn, and the memory cells in each column are coupled in parallel between a ground terminal GND and each of bit lines B0 to Bn. The erasable and programmable read only memory device further comprises a set of row address terminals RA0 to RAn where a row address signal is supplied, a set of column address terminals CA0 to CAn where a column address signal is supplied, a first control terminal where a chip enable signal CE with over-bar of active low level is supplied, a second control terminal where a positive voltage level Vcc of about 5 volts is applied, and a multi-purpose input terminal 15 which is shared by an output enable signal OE with over-bar of active low level and a programming signal or voltage Vpp of about 12.5 volts.

The row address terminals RA0 to RAn are coupled in parallel to a row address buffer circuit 16 which in turn is coupled to a row address decoder circuit 17. Then, the row address signal is latched by the row address buffer circuit 16 and supplied to the row address decoder circuit 17 for activation of one of the word lines W0 to Wn. When one of the word lines W0 to Wn is activated, data bits are read out from the memory cells coupled to the activated word line to the respective bit lines B0 to Bn. Similarly, the column address terminals CA0 to CAn are coupled to a column address buffer circuit 18 which in turn is coupled to a column address buffer circuit 19. The column address decoder circuit 19 is provided in association with a column selector circuit 20 which is provided with a plurality of gate transistors 201 to 20n provided in the bit lines B0 to Bn, respectively. Then, the column address signal is also latched by the column address buffer circuit 18 and, then, decoded by the column address decoder circuit 19 for causing one of the gate transistors 201 to 20n to turn on. Thus, a bit line is selected from the bit lines B0 to Bn, so that the data bit on the selected bit line is transferred to a sense amplifier circuit 21.

To the first control terminal is coupled a chip enable buffer circuit 22 which produces the inverse thereof and distributes the inverse of the chip enable signal CE with over-bar to both of a data input circuit 23 and a data output circuit 24 for activation thereof. On the other hand, the multi-purpose input terminal 15 is coupled in parallel to an output enable buffer circuit 25 and a high voltage level detecting circuit 26, and the output enable signal OE with over-bar is supplied to the output enable buffer circuit 25 which produces the inverse thereof and transfers the inverse of the output enable signal OE with over-bar to the data output circuit 24. With the inverse of the chip enable signal CE with over-bar and the inverse of the output enable signal OE with over-bar, the data output circuit 24 is completely activated, so that the data bit amplified by the sense amplifier circuit 21 is supplied to the data output circuit 24 and, then, transferred to an input/output data terminal 27. Thus, the read-out operation starts with the row address signal, the column address signal, the chip enable signal CE with over-bar and the output enable signal OE with over-bar and is completed with the data bit at the input-/output data terminal 27.

Figure 5:
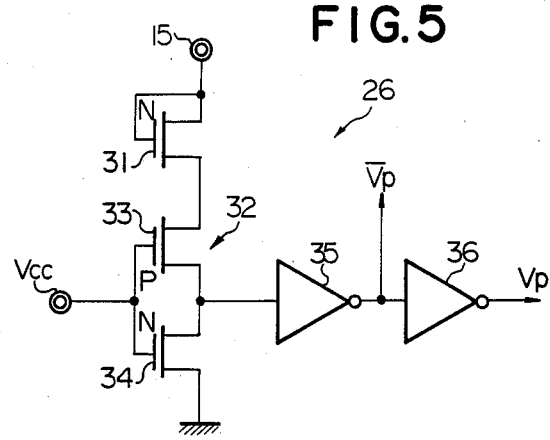
FIG. 5 is a diagram showing the circuit arrangement of the high voltage level detecting circuit incorporated in the input circuit shown in FIG. 4.

When the erasable and programmable read only memory device enters upon a write-in or programming mode of operation, the programming signal or voltage Vpp of about 12.5 volts is detected by the high voltage level detecting circuit 26 for producing a write-in enable signal Vp. However, the output enable buffer circuit 25 is shifted into an inactive state with the programming signal or voltage Vpp, thereby causing the data output circuit to terminate the function. The high voltage level detecting circuit 26 has a circuit arrangement illustrated in FIG. 5 and comprises a series combination of an n-channel type field effect transistor 31 serving as a load transistor and a complementary inverter circuit 32 provided with a p-channel type field effect transistor 33 and an n-channel type field effect transistor 34, and the series combination is coupled between the multi-purpose input terminal 15 and the ground terminal GND. The complementary inverter circuit 32 has an input node coupled to the second control terminal and an output node coupled to an inverter circuit 35 which in turn is coupled to an inverter circuit 36. Since the p-channel type field effect transistor 33 is supplied at the gate electrode thereof with the positive voltage level Vcc of about 5 volts, the p-channel type field effect transistor 33 remains off in so far as the output enable signal OE with over-bar at the multi-purpose input terminal 15 swings its voltage level between the ground voltage level and the positive voltage level of about 5 volts. Then, the write-in enable signal Vp remains in the ground voltage level during the read-out mode of operation. On the other hand, if the programming signal or voltage Vpp of about 12.5 volts is supplied to the multi-purpose input terminal 15, the p-channel type field effect transistor 33 turns on to cause the inverter circuit 36 to produce the write-in enable signal Vp of about 5 volts. The write-in enable signal Vp is supplied in parallel to a write-in control signal producing circuit 40 and the data input circuit 23, and the inverse of the write-in enable signal Vp is supplied to the sense amplifier circuit 21. During the inverse of the write-in enable signal Vp is in the active high level, the sense amplifier circuit 21 is activated, but the inverse of the inactive low level shifts the sense amplifier circuit 21 into the inactive state.

Figure 6:
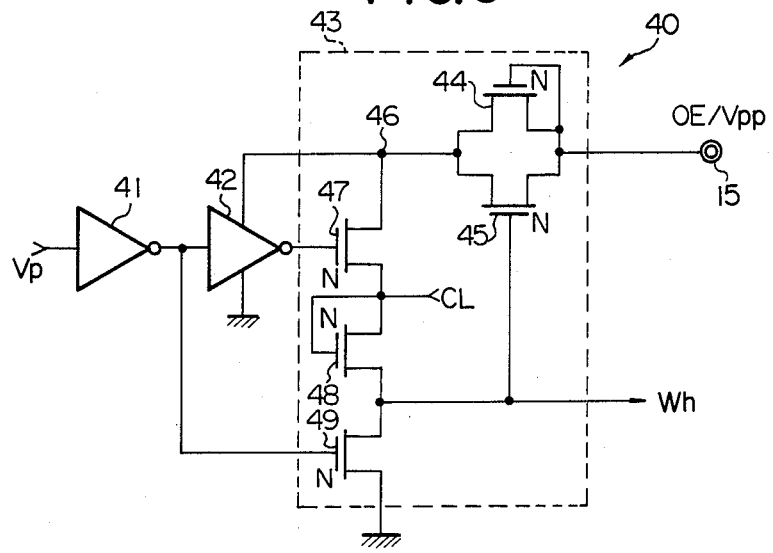
FIG. 6 is a diagram showing the circuit arrangement of the write-in control signal producing circuit incorporated in the input circuit shown in FIG. 4.

The write-in control signal producing circuit 40 is illustrated in detail in FIG. 6 of the drawings. The write-in control signal producing circuit 40 comprises a series of inverter circuits 41 and 42 and a charge-pump circuit 43 which has two n-channel type field effect transistors 44 and 45 coupled in parallel between the multi-purpose input terminal 15 and a node 46, and a series of n-channel type field effect transistors 47, 48 and 49 coupled between the node 46 and the ground terminal GND. The n-channel type field effect transistors 47 and 49 are gated by the inverter circuits 42 and 41, respectively, but a gate electrode of the n-channel type field effect transistor 48 is supplied with a clock signal CL swinging its voltage level between the ground voltage level and the positive voltage level of about 5 volts. Moreover, the n-channel type field effect transistor 44 has a gate electrode coupled to the multi-purpose input terminal 15, but the n-channel type field effect transistor 45 is supplied with the write-in control signal Wh. In this instance, the n-channel type field effect transistors 45, 47 and 48 have a threshold voltage of about 1 volt. The write-in control signal producing circuit 40 thus arranged forces the write-in control signal Wh into the inactive low level with the write-in enable signal Vp of the inactive low level, because the inverter circuit 41 causes the n-channel type field effect transistor 49 to turn on. On the other hand, when the write-in enable signal Vp goes up to the active high level, the inverter circuit 41 allows the n-channel type field effect transistor 49 to turn off for blocking the conduction path from the ground terminal GND. The n-channel type field effect transistor 44 turns on with the programming signal or voltage Vpp of about 12.5 volts, and the clock signal CL is supplied to the n-channel type field effect transistor 48. In this situation, the write-in control signal Wh rises in voltage level toward an extremely high voltage level of about 14.5 volts. When the write-in control signal Wh excesses the programming signal or voltage Vpp and is higher than the programming signal or voltage Vpp by the threshold voltage of about 1 volt, the n-channel type field effect transistor 45 turns on to further bootstrap the write-in control signal Wh. Finally, the write-in control signal Wh reaches an extremely high voltage level of about 15.5 volts.

Figure 7:
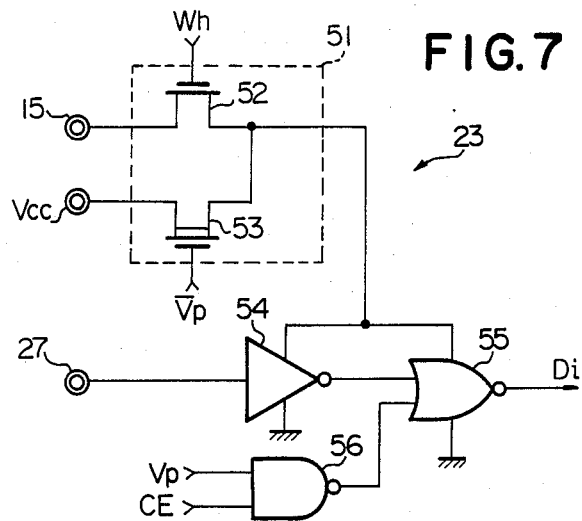
FIG. 7 is a diagram showing the circuit arrangement of the data input circuit incorporated in the input circuit shown in FIG. 4.

As described hereinbefore, the data input circuit 23 has a circuit arrangement illustrated in FIG. 7 and comprises a power controlling circuit 51 having two field effect transistors 52 and 53, and the field effect transistors are responsive to the write-in control signal Wh and the inverse of the write-in enable signal Vp, respectively. Namely, when the erasable and programmable read only memory device enters upon the read-out mode of operation, the inverse of the write-in enable signal and the write-in control signal Wh are respectively shifted into the high voltage level and the low voltage level, so that the field effect transistor 53 provides a conduction path from the second control terminal to an inverter circuit 54 and a NOR gate 55. Then, the positive high voltage level of about 5 volts is supplied to the inverter circuit 54 and the NOR gate 55. However, the write-in enable signal Vp of the in active low voltage level is supplied to a NAND gate 56, so that the NAND gate 56 causes the NOR gate 55 to remain in the inactive state, thereby producing a gate control signal Di in the inactive low voltage level regardless of the data bit at the input/output data terminal 27. However, when the erasable and programmable read only memory device enters upon the programming mode of operation, the write-in control signal Wh goes up to the active high voltage level, so that the n-channel type field effect transistor 52 provides a conduction path from the multi-purpose input terminal 15 to the inverter circuit 54 and the NOR gate 55. The write-in enable signal Vp is shifted to the active high voltage level in the programming mode of operation, so that the NAND gate 56 is activated to produce the output signal of the active low voltage level in the presence of the inverse of the chip enable CE with over-bar signal in the high voltage level. When the output signal of the active low voltage level is supplied from the NAND gate 56 to the NOR gate 55, the NOR gate 55 is also activated to respond to the inverse of the input data signal supplied to the input/output data terminal 27. With the programming signal or voltage Vpp of about 12.5 volts supplied from the multi-purpose input terminal 15 through the n-channel type field effect transistor 52, the NOR gate 55 produces the gate control signal Di of about 12.5 volts in the presence of the input data bit of the high voltage level. However, if the input data bit is in the low voltage level, the gate control signal Di remains in the ground level.

Turning back to FIG. 4 of the drawings, the second control terminal is coupled to a series combination of n-channel type field effect transistors 29 and 30, and the n-channel type field effect transistor 29 has a gate electrode coupled to the source node thereof for serving as a load transistor, but the n-channel type field effect transistor 30 is supplied with the gate control signal Di. Between the n-channel type field effect transistors 29 and 30 is coupled an n-channel type field effect transistor 28 which has a gate electrode supplied with the write-in control signal Wh. The node between the n-channel type field effect transistors 29 and 30 is hereinunder referred to as node N1. As described hereinbefore, the erasable and programmable read only memory device is supplied with the programming signal or voltage Vpp of about 12.5 volts and produces the write-in control signal Wh of about 15.5 volts in the programming mode of operation, so that the programming signal or voltage Vpp is transferred to the n-channel type field effect transistor 30 without reduction in voltage level. In this situation, if a memory cell of the array 12 is selected by the row address signal and the column address signal, the input data bit is written into the memory cell. Namely, if the input data bit is in the low voltage level, the gate control signal Di remains in the ground voltage level, so that the n-channel type field effect transistor 30 does not propagate the programming signal. Then, no electron injection takes place in the selected memory cell. However, if the input data bit is in the high voltage level, the gate control signal Di goes up to the extremely high voltage level of about 12.5 volts, so that electrons are injected to the floating gate of the selected memory cell for memorizing the input data bit.

In the read-out mode of operation, even if the undershoot takes place in the output enable signal OE with over-bar, the n-channel type field effect transistor 28 may turn on. However, the positive voltage level Vcc is supplied form the n-channel type field effect transistor 29 to the node N1, so that the n-channel type field effect transistor 30 blocks the data bit read out from the selected memory cell. This is because of the fact that the n-channel type field effect transistor 30 is supplied with a voltage level decided by a proportional allotment on the basis of the channel resistances between the n-channel type field effect transistors 28 and 29. Then, if the channel resistances are selected in such a manner that a difference between the node N1 and the gate electrode is smaller than the threshold voltage of the n-channel type field effect transistor 30, the output enable signal OE with over-bar has no influence upon the data bit read out from the selected memory cell. In the circuit diagrams, all of the inverter circuits, all of the AND gates and other component circuits are supplied with the positive voltage level Vcc.

Third embodiment

Figure 8:
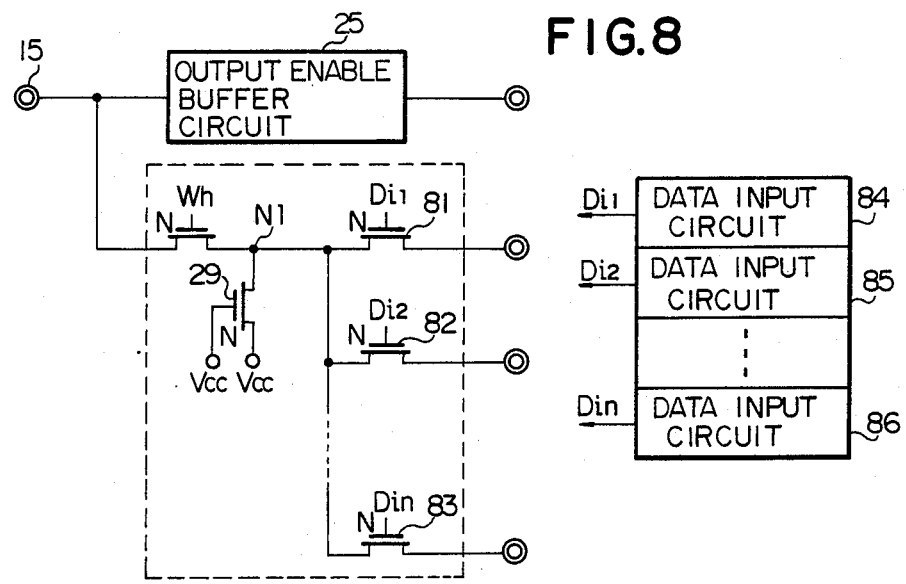
FIG. 8 is a diagram showing the circuit arrangement of another input circuit embodying the present invention.

Turning to FIG. 8 of the drawings, another input circuit according to the present invention is illustrated. A difference between the input circuits respectively shown in FIGS. 4 and 8 is that the input circuit shown in FIG. 8 has a plurality of n-channel type field effect transistors 81, 82 and 83 respectively accompanied by data input circuits 84, 85 and 86 which produces the gate control signals $Di_1$, $Di_2$ and Din, respectively. Then, a plurality of the input data bits are simultaneously written into the selected memory cells.

Although particular embodiments of the present invention have been shown and described, it will be obvious to those skilled in the art that various changes and modifications may be made without departing from the spirit and scope of the present invention. For example, the input circuit according to the present invention is applicable to a single chip micro-computer which has an instruction memory of the erasable and programmable read only memory. In this implementation, the input circuit may be provided in association with a multi-purpose input terminal which is shared by a reset signal and the programming signal.

What is claimed is:

1. An input circuit incorporated in a semiconductor device, said input circuit being provided in association with a multi-purpose input terminal which is shared by first and second input signals different in voltage level from each other, comprising:
   (a) an input buffer circuit for receiving said first input signal;
   (b) a series combination of a first field effect transistor, an intermediate node and a second field effect transistor coupled between said multi-purpose input terminal and an internal circuit to which said second input signal is supplied;
   (c) resistor means coupled between a source of constant voltage and said intermediate node;
   (d) a first control circuit producing a first gate control signal supplied to a gate electrode of said second field effect transistor; and
   (e) a second control circuit capable of detecting said second input signal and producing a second gate control signal supplied to a gate electrode of said first field effect transistor.

2. An input circuit as set forth in claim 1, in which said first field effect transistor and said resistor means have respective resistances selected in such a manner that a difference in voltage level between said intermediate node and the gate electrode of said second field effect transistor is smaller than a threshold voltage of the second field effect transistor even if said first input signal is higher in voltage level than a predetermined level.

3. An input circuit as set forth in claim 2, in which said first and second input signals are a control signal shifting its voltage level between a middle voltage level and a relatively low voltage level and a programming signal of a relatively high voltage level, respectively.

4. An input circuit as set forth in claim 3, in which said first control circuit is an input data circuit responsive to an input data bit and shifting said second field effect transistor between an on-state and an off-state depending upon the logic level of said input data bit.

5. An input circuit as set forth in claim 4, in which said second control circuit comprises a programming signal detecting circuit operative to detect the programming signal at said multi-purpose input terminal for producing a write-in enable signal and a write-in control signal producing circuit responsive to the write-in enable signal for producing a write-in control signal larger in voltage level than the programming signal by a voltage value equal to or larger than a threshold voltage of said first field effect transistor.

6. An input circuit as set forth in claim 5, in which said input data circuit comprises a first inverter circuit coupled at the input node thereof to an data input terminal, a NAND gate activated in the presence of said write-in enable signal and responsive to a chip enable signal for producing an activation signal, a NOR gate activated by the activation signal and responsive to an output signal of said first inverter circuit for producing said first gate control signal, and a power controlling circuit operative to supply the first inverter circuit and the NOR gate with one of said middle voltage level and said relatively high voltage level.

7. An input circuit as set forth in claim 6, in which said first and second field effect transistors are of the n-channel type.

8. An input circuit as set forth in claim 7, in which said power controlling circuit comprises third and fourth n-channel type field effect transistors coupled in parallel to said multi-purpose input terminal and in which said third and fourth n-channel type field effect transistors have respective gate electrodes supplied with said write-in control signal and the inverse of said write-in enable signal, respectively.

9. An input circuit as set forth in claim 7, in which said programming signal detecting circuit comprises a series combination of a fifth n-channel type field effect transistor serving as a resistor, a p-channel type field effect transistor and a sixth n-channel type field effect transistor coupled between said multi-purpose input terminal and a ground terminal, and a series combination of second and third inverter circuits coupled to a common drain node provided between the p-channel type field effect transistor and the sixth n-channel type field effect transistor and in which said p-channel type field effect transistor and said sixth n-channel type field effect transistor have respective gate electrodes supplied with said middle voltage level.

10. An input circuit as set forth in claim 7, in which said write-in control signal producing circuit comprises a charge-pump circuit responsive to a clock signal to produce an extremely high voltage level and a series combination of fourth and fifth inverter circuits supplied with said write-in enable signal, said extremely high voltage level being larger in value than the relatively high voltage level of said programming signal.

11. An input circuit as set forth in claim 10, in which said charge-pump circuit comprises a series combination of seventh and eighth n-channel type field effect transistors coupled in parallel between said multi-purpose input terminal and a node and a series combination of ninth, tenth and eleventh n-channel type field effect transistors coupled between the node and said ground terminal, said ninth and eleventh n-channel type field effect transistors having respective gate electrodes coupled to said fifth and fourth inverter circuits, respectively, said tenth n-channel type field effect transistor having a gate electrode supplied with said clock signal, an output node for said write-in control signal being provided between said tenth and eleventh n-channel type field effect transistors and coupled to a gate electrode of said eighth n-channel type field effect transistor.

12. An input circuit as set forth in claim 11, in which said resistor means is formed by a twelfth n-channel type field effect transistor having a gate electrode coupled to a source node thereof.

13. An input circuit comprising an input signal circuit coupled at an input node thereof to a multi-purpose input terminal shared by an input signal and a programming signal and at an output node thereof to a signal output terminal, in which said input circuit further comprises a programming signal input circuit provided with a first field effect transistor having a drain node coupled to said multi-purpose input terminal and a gate electrode supplied with a write-in enable signal, a second field effect transistor having a drain node coupled to a source of voltage, a gate electrode coupled to the source of voltage and a source node coupled to a source node of said first field effect transistor, and at least one write-in transistor having a drain node coupled to the respective source nodes of said first and second field effect transistors, a source node coupled to a programming signal output terminal and a gate electrode supplied with a write-in data bit.

14. An input circuit comprising:
(a) an input terminal supplied with a first signal in a first mode of operation and a second signal different in voltage level from the first signal in a second node of operation;
(b) a first internal circuit supplied with said first signal applied to said input terminal;
(c) a second internal circuit supplied with said second signal applied to said input terminal;
(d) a transistor having a gate electrode and first and second electrodes which are coupled to said input terminal and said second internal circuit, respectively;
(e) means capable of producing first and second voltage levels different from each other, said first voltage level being supplied to the gate electrode of said transistor in said first mode of operation for causing the transistor to turn off, said second voltage level being supplied to the gate electrode of said transistor in said second mode of operation for allowing the transistor to turn on, thereby allowing said transistor to transfer said second signal to said second internal circuit in said second mode of operation only; and
(f) means coupled between the first electrode of said transistor and said input terminal and operative to supply the first electrode in said first node of operation with a voltage level which is different from said first voltage level by a value less than a threshold voltage value of said transistor.

15. A semiconductor memory comprising
(a) a plurality of memory cells each having an insulating gate transistor provided with a floating gate;
(b) first and second nodes;
(c) means responsive to an address signal and selecting one of said memory cells for coupling said one of said memory cells to said first node;
(d) a terminal supplied with an output enable signal in a read-out mode of operation and with a programming voltage in a write-in mode of operation;

(e) a first transistor coupled between said terminal and said second node and shifted into an off state in said read-out mode of operation, said first transistor being shifted into an on state in said write-in mode of operation for transferring said programming voltage to said second node;

(f) a second transistor coupled between said first and second nodes and shifted into an off state in said read-out mode of operation, said second transistor being shifted between said off state and an on state depending upon a logic level of a write-in data bit in said write-in mode of operation, said second transistor being operative to electrically couple said first node with said second node when being shifted into said on state;

(g) a third transistor coupled between said second node and a voltage node and having a gate electrode coupled to the voltage node; and (h) means coupled to said terminal and said first node and responsive to said output enable signal for detecting a voltage level at said first node to produce an output data bit on the basis of a read-out data bit stored in said one of said memory cells nodes.

* * * * *

UNITED STATES PATENT AND TRADEMARK OFFICE
CERTIFICATE OF CORRECTION

PATENT NO. : 4,910,710
DATED : March 20, 1990
INVENTOR(S) : Hiroyuki KOBATAKE

It is certified that error appears in the above-identified patent and that said Letters Patent is hereby corrected as shown below:

Col. 4, line 1, delete "(R28 ± Vcc - R29 x V)" and insert --(R 28 x Vcc - R29 x V)--

Signed and Sealed this

Second Day of July, 1991

Attest:

HARRY F. MANBECK, JR.

*Attesting Officer*     Commissioner of Patents and Trademarks